United States Patent
Drago et al.

(10) Patent No.: US 11,094,845 B2
(45) Date of Patent: Aug. 17, 2021

(54) METHOD OF PRODUCING LIGHT-EMITTING DIODE CHIPS AND LIGHT-EMITTING DIODE CHIP

(71) Applicant: OSRAM Opto Semiconductors GmbH, Regensburg (DE)

(72) Inventors: Massimo Drago, Riedenburg (DE); Alexander Frey, Lappersdorf (DE); Joachim Hertkorn, Wörth an der Donau (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/489,835

(22) PCT Filed: Mar. 15, 2018

(86) PCT No.: PCT/EP2018/056558
§ 371 (c)(1),
(2) Date: Aug. 29, 2019

(87) PCT Pub. No.: WO2018/177764
PCT Pub. Date: Oct. 4, 2018

(65) Prior Publication Data
US 2020/0235264 A1  Jul. 23, 2020

(30) Foreign Application Priority Data
Mar. 30, 2017  (DE) .................. 10 2017 106 888.0

(51) Int. Cl.
*H01L 33/22*  (2010.01)
*H01L 33/00*  (2010.01)
(Continued)

(52) U.S. Cl.
CPC ............ *H01L 33/22* (2013.01); *H01L 33/007* (2013.01); *H01L 33/0093* (2020.05);
(Continued)

(58) Field of Classification Search
CPC ... H01L 33/007; H01L 33/0075; H01L 33/32; H01L 33/22; H01L 33/12
See application file for complete search history.

(56) References Cited

U.S. PATENT DOCUMENTS

| 6,442,184 B1 | 8/2002 | Ota et al. |
| 9,343,615 B2 | 5/2016 | Hertkorn et al. |

(Continued)

FOREIGN PATENT DOCUMENTS

| DE | 196 40 594 A1 | 4/1998 |
| DE | 10 2011 012 928 A1 | 9/2012 |
| WO | 2016/002419 A1 | 1/2016 |

*Primary Examiner* — Moazzam Hossain
*Assistant Examiner* — Mohammad A Rahman
(74) *Attorney, Agent, or Firm* — DLA Piper LLP (US)

(57) ABSTRACT

A method of producing light-emitting diode chips includes A) and C)-F) in order: A) providing a growth substrate, C) producing a structural layer, the structural layer including $Al_{x1}Ga_{1-x1-y1}In_{y1}N$, where-in $y1 \geq 0.5$, and a plurality of structural elements with a mean height of at least 50 nm so that a side of the structural layer facing away from the growth substrate is rough, D) producing a cover layer on the structural layer, the cover layer forming the structural layer true to shape and including $Al_{x2}Ga_{1-x2-y2}In_{y2}N$, wherein $x2 \geq 0.6$, E) producing a planarization layer on the cover layer, a side of the finished planarization layer is flat and the planarization layer includes $Al_{x3}Ga_{1-x3-y3}In_{y3}N$, wherein $x3+y3 \leq 0.2$, and F) growing a functional layer sequence that generates radiation on the planarization layer.

16 Claims, 6 Drawing Sheets

(51) Int. Cl.
   *H01L 33/12* (2010.01)
   *H01L 33/32* (2010.01)

(52) U.S. Cl.
   CPC .............. *H01L 33/12* (2013.01); *H01L 33/32* (2013.01); *H01L 2933/0091* (2013.01)

(56) References Cited

U.S. PATENT DOCUMENTS

| | | |
|---|---|---|
| 2003/0141508 A1 | 7/2003 | Okuyama et al. |
| 2005/0035359 A1 | 2/2005 | Ishida et al. |
| 2005/0037526 A1* | 2/2005 | Kamiyama ............. H01L 33/24 438/22 |
| 2006/0043396 A1* | 3/2006 | Tsuda ...................... H01L 33/32 257/94 |
| 2008/0121903 A1 | 5/2008 | Hiramatsu et al. |
| 2010/0044719 A1 | 2/2010 | Yu et al. |
| 2011/0210425 A1 | 9/2011 | Su et al. |
| 2014/0061694 A1* | 3/2014 | Leirer ................. H01L 21/0254 257/95 |
| 2014/0073120 A1 | 3/2014 | You et al. |
| 2015/0168840 A1* | 6/2015 | Hardtdegen ............ G03F 7/201 250/492.1 |
| 2015/0187992 A1* | 7/2015 | Huang ................... H01L 33/20 438/27 |
| 2016/0343903 A1 | 11/2016 | Ueta et al. |

* cited by examiner

A)

B)

C)

D)

A)

B)

A)

B)

METHOD OF PRODUCING LIGHT-EMITTING DIODE CHIPS AND LIGHT-EMITTING DIODE CHIP

TECHNICAL FIELD

This disclosure relates to a method of producing light-emitting diode chips and a light-emitting diode chip.

BACKGROUND

There is a need to provide a method by which a semiconductor layer sequence for a light-emitting diode chip can be produced efficiently with high quality.

SUMMARY

We provide a method of producing light-emitting diode chips including A) and C)-F) in order: A) providing a growth substrate, C) producing a structural layer, the structural layer including $Al_{x1}Ga_{1-x1-y1}In_{y1}N$, wherein $y1 \geq 0.5$, and a plurality of structural elements with a mean height of at least 50 nm so that a side of the structural layer facing away from the growth substrate is rough, D) producing a cover layer on the structural layer, the cover layer forming the structural layer true to shape and including $Al_{x2}Ga_{1-x2-y2}In_{y2}N$, wherein $x2 \geq 0.6$, E) producing a planarization layer on the cover layer, a side of the finished planarization layer is flat and the planarization layer includes $Al_{x3}Ga_{1-x3-y3}In_{y3}N$, wherein $x3+y3 \leq 0.2$, and F) growing a functional layer sequence that generates radiation on the planarization layer.

We also provide a light-emitting diode chip including a carrier and a semiconductor layer sequence on the carrier, wherein at a planar side of a planarization layer including $Al_{x3}Ga_{1-x3-y3}In_{y3}N$, wherein $x3+y3 \leq 0.2$, facing the carrier, the semiconductor layer sequence includes a functional layer sequence that generates radiation, directly on a side of the planarization layer facing away from the carrier, a continuous cover layer includes $Al_{x2}Ga_{1-x2-y2}In_{y2}N$, wherein $x2 \geq 0.6$, is formed, the cover layer is part of the semiconductor layer sequence, a plurality of pyramid-shaped structural elements are formed in the planarization layer and in the cover layer, the cover layer covers the structural elements true to shape, and the structural elements are partially filled with $Al_{x2}Ga_{1-x2-y2}In_{y2}N$, wherein $x2 \geq 0.6$.

Figure 1:
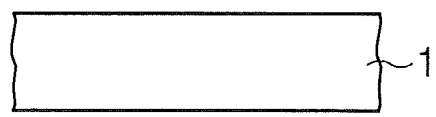
FIGS. 1, 2, 3A, 3B, 3C, 4A, 5, 6, 7a, 7B, 8A, 8B, 8C, 8D, 9 and 10 show schematic sectional representations of method steps of producing light-emitting diode chips.

LIST OF REFERENCE SIGNS 10 light-emitting diode chip
1 growth substrate
11 dome structures
2 buffer layer
3 structural layer
30 continuous partial layer of the structural layer
33 pyramid-shaped structural elements
4 cover layer
5 planarization layer
6 intermediate layer
7 functional layer sequence
27 semiconductor layer sequence
8 carrier
H main growth direction of the semiconductor layer sequence
L laser radiation

DETAILED DESCRIPTION

Our method produces light-emitting diode chips, LED chips for short. In particular, the light-emitting diode chips to be produced generate visible light, for example, blue or green or red light or, alternatively, near ultraviolet or near infrared radiation. A wavelength of maximum intensity of the radiation generated is, for example, at least 360 nm or 400 nm and/or at most 1060 nm or 850 nm or 780 nm or 520 nm.

The method may comprise the step of providing a growth substrate. The growth substrate is, for example, a transparent substrate such as sapphire. It is also possible for substrates made of semiconductor materials such as silicon or silicon carbide to be used. Preferably, the growth substrate is only a temporary substrate that is no longer present in the finished light-emitting diode chips.

The method may comprise the step of generating a structural layer. The structural layer has a plurality of structural elements. The structural elements are preferably pyramidal or in the form of truncated pyramids. Hexagonal pyramids can be produced. The structural layer and the structural elements are produced particularly preferably directly by growing the structural layer, for example, epitaxially or by sputtering. This means that the structural elements are not produced by subsequent removal of material such as etching so that no material removal from the structural layer takes place during production of the structural layer or essentially no removal of material from the structural layer takes place.

A side of the structural layer facing away from the growth substrate may be rough. A mean roughness corresponds, for example, to a mean height of the structural elements. In other words, the roughness is caused by the structural elements.

The structural layer may be composed of $Al_{x1}Ga_{1-x1-y1}In_{y1}N$. $y1$ is preferably greater than or equal to 0.5 or 0.7 or 0.9. The sum of $x1$ and $y1$ is preferably at least 0.6 or 0.8. Especially preferably, the structural layer and thus the structural elements are of InN and, hence, free or substantially free of Al and/or Ga.

Only the essential components of the crystal lattice are given. The respective layers can have further constituents or impurities such as C, O, Mg and/or Si in small quantities. It is possible for the respective layers to be provided with one or more dopants not explicitly mentioned. The term 'small quantity' refers in particular to a proportion by weight of at most 0.1% and/or to a concentration of at most $5 \times 10^{22}$ cm$^{-3}$ or $5 \times 10^{23}$ cm$^{-3}$.

The method may comprise the step of producing a cover layer. The cover layer is preferably deposited directly and immediately on the structural layer. The cover layer forms the structural layer true to shape. That is, in the direction parallel to a main growth direction of the semiconductor layer sequence, the cover layer preferably has a constant and not varying thickness and preferably extends without gaps and continuously over the structural layer, at least immediately after a step of producing the cover layer. After the cover layer has been produced, the structural elements can be seen because the cover layer adopts the shape of the structural elements on a side facing away from the growth substrate.

The cover layer may be composed of $Al_{x2}Ga_{1-x2-y2}In_{y2}N$. In this example, x2 is greater than or equal to 0.6 or 0.8 or 0.9. y2 is preferably at most 0.3 or 0.2 or 0.1 or 0.05. The cover layer can be free of In. The cover layer is especially preferred both free of Ga and In so that the cover layer is an AlN layer.

A planarization layer may be produced on the cover layer, preferably directly and immediately on the cover layer. The surface of the completely produced planarization layer facing away from the growth substrate is flat. The planarization layer is produced, for example, by two-dimensional growth so that during production of the planarization layer material is deposited essentially only in the direction parallel to a main side of the growth substrate, the semiconductor layer sequence is deposited on the substrate.

The planarization layer may be composed of $Al_{x3}Ga_{1-x3-y3}In_{y3}N$. The sum of x3 and y3 is preferably less than or equal to 0.2 or 0.1 or 0.05. In particular, the planarization layer is composed of GaN and is free of Al and In.

The method may comprise the step of growing a functional layer sequence. The functional layer sequence is grown on the planarization layer, directly or indirectly. In the finished light-emitting diode chips, the functional layer sequence is configured to generate radiation. The functional layer sequence has an active zone such as a single quantum well structure or a multiple quantum well structure or a pn junction. The functional layer sequence is preferably based on the material system AlInGaN.

The method may be configured to produce light-emitting diode chips and may have the following steps, preferably in the order given below:

A) providing a growth substrate,
C) producing a structural layer, in particular with a plurality of pyramid-shaped structural elements, the structural layer is of $Al_{x1}Ga_{1-x1-y1}In_{y1}N$ with y1≥0.5,
D) producing a cover layer on the structural layer, the cover layer is of $Al_{x2}Ga_{1-x2-y2}In_{y2}N$ with x2≥0.6, and forms the structural layer true to shape,
E) producing a planarization layer on the cover layer, the side of the finished planarization layer facing away from the growth substrate is flat and the planarization layer is of $Al_{x3}Ga_{1-x3-y3}In_{y3}N$ with x3+y3≤0.2, and
F) growing a functional layer sequence for generating radiation on the planarization layer.

Typically, the growth of III-nitrides on sapphire is difficult because of the great difference in lattice constants between sapphire and the III-nitride. In addition, separation of the growth substrate, in particular the sapphire substrate, from the finished semiconductor layer sequence constitutes a challenge.

Possibilities to overcome the problem of lattice mismatch between the semiconductor layer sequence and the growth substrate are, for example, the use of substrates with a structured surface, or the use of mask layers, for example, of silicon nitride. A two-dimensional and three-dimensional growth is carried out on the basis of such structurings to achieve defect reduction by mutual annihilation of dislocations.

A structuring is formed by a semiconductor material of the semiconductor layer sequence itself. Defect reduction is made possible by using such a semiconductor material. In addition, using a suitable semiconductor material enables a relaxation of tensions and an improved adaptation of lattice constants to the functional layer sequence. Furthermore, the structural layer can serve as an absorbing layer in a laser lift-off process so that removing the growth substrate is made easier.

In particular because of the combination of the structural layer, which is, for example, of InN, and of the cover layer made of AlGaN, it is possible to achieve an efficient lattice matching to the lattice constant of GaN or InGaN for the functional layer sequence. It is also possible for a MOVPE process step for defect reduction to be omitted or shortened, going ahead with a cost reduction. By the efficient absorption of laser radiation in the structural layer, a laser lift-off process, LLO for short, with distinctly increased speed, improved yield and better quality can be performed.

It is possible to wet-chemically or dry-chemically produce a roughened surface after removal of the growth substrate, preferably by LLO. For high extraction efficiency, the roughening preferably has a mean roughness of at least λ/n, wherein λ is the wavelength of maximum intensity of the radiation generated and n is the mean refractive index of the semiconductor layer sequence. The structural layer can optionally be partially or completely removed during the production of the roughening. Analogously, the cover layer can be partially or completely removed.

The method may comprise a step B). Step B) may be carried out between steps A) and C). In step B), a buffer layer is produced preferably directly on the growth substrate. The buffer layer is composed of $Al_{x4}Ga_{1-x4-y4}In_{y4}N$. y4 is preferably at most 0.1 or 0.05, or the buffer layer is free of indium. Furthermore, the buffer layer is preferably rich of Al so that x4≥0.4 or 0.5 or 0.7 or 0.85. Further, the buffer layer can be rich of Ga so that 1-x4-y4 is greater than or equal to 0.3 or 0.4 or 0.5. In this example, 1-x4-y4 is preferably at most 0.7 or 0.5. Particularly preferably, the buffer layer consists of AlN and is thus free of Ga and In.

The buffer layer may have a thickness of at least 10 nm or 20 nm. As an alternative or in addition, the thickness of the buffer layer is at most 200 nm or 100 nm or 70 nm. In particular, the buffer layer has a thickness of approximately 30 nm.

The structural layer may be produced directly on the growth substrate, in particular as a continuous layer that completely covers the growth substrate. A buffer layer is omitted in this example.

The buffer layer may be radiation-transmissive at wavelengths above 360 nm. In other words, a band gap of the material of the buffer layer is at least 3.45 eV. Thus, the buffer layer is transmissive for the laser radiation, for example, at a wavelength of 365 nm, of the laser lift-off method. Thus, it is possible to efficiently absorb the laser radiation used in the laser lift-off process in the structural layer.

The structural elements of the structural layer may have an mean height of at least 20 nm or 50 nm or 70 nm. Alternatively or additionally, the mean height is at most 400 nm or 300 nm or 200 nm.

The structure elements may have a height distribution across the growth substrate. The height distribution is preferably a Gaussian distribution or approximately a Gaussian distribution, also referred to as normal distribution. The height distribution can preferably be characterized by the mean height of the structural elements and by a standard deviation. The standard deviation is preferably at least 20% or 30% or 40% of the mean height and/or at most 70% or 60% or 50% of the mean height. In other words, the mean heights of the structural elements have a comparatively large fluctuation width. Within statistical fluctuations, the mean height is preferably constant across the growth substrate so that the growth substrate does not have partial regions with a deliberately larger or deliberately smaller height of the structural elements.

The method may comprise a step G) that follows step F). In step G), the semiconductor layer sequence, in particular the functional layer sequence that generates radiation is removed from the growth substrate by a laser lift-off process. In this example, the laser radiation passes through the growth substrate and optionally the buffer layer and is absorbed in the structural layer. Hence, the structural layer is partially or completely destroyed so that adhesion between the growth substrate and the functional layer sequence is lost. In other words, the detachment takes place in the region of the structural layer.

The structural layer may be produced as a closed, continuous layer. Thus, the structural layer may have a continuous partial layer located between the structural elements and the growth substrate. A thickness of this partial layer is preferably at least 5 nm or 10 nm or 20 nm and/or at most 100 nm or 50 nm.

The cover layer may be a continuous, uninterrupted layer. The cover layer is preferably composed of $Al_{x2}In_{y2}N$ with $x2 \geq 0.75$ or $x2 \geq 0.85$.

The cover layer may have a thickness of at least 10 nm or 30 nm or 50 nm. As an alternative or in addition, the thickness of the cover layer may be at most 150 nm or 100 nm or 70 nm. In other words, the cover layer is comparatively thick.

The structural layer, the cover layer and/or the optional buffer layer may be produced by sputtering. All three layers are preferably produced by sputtering, in particular in the same sputtering system. This makes it possible to produce these layers efficiently.

The planarization layer and/or the functional layer sequence may be epitaxially grown, in particular by MOVPE, that is by metal organic vapor phase epitaxy.

A side of the growth substrate facing the structural layer, on which either the structural layer or the buffer layer is deposited directly, may be formed in a planar manner. In other words, there is no structured growth substrate such as a patterned sapphire substrates, PSS for short.

A side of the growth substrate facing the structural layer, on which either the structural layer or the buffer layer is deposited directly, may be structured. For example, this side of the growth substrate is provided with a regular or irregular arrangement of domes or cones or has conical or dome-shaped recesses. Thus, the growth substrate can be a patterned sapphire substrate, PSS for short. A mean structure size of structures of the growth substrate is preferably at least 0.4 µm and/or at most 5 µm.

The structural layer may be grown without structural elements. In other words, the structural layer is, for example, a plane-parallel layer, in particular with a thickness which remains constant throughout. In this example, the structural layer is preferably made of InN, that is, free or essentially free of Al and Ga. Further, in this example, the growth substrate is preferably a sapphire substrate. An efficient laser lift-off process can be carried out by such a structural layer.

The method may comprise a step E1) carried out between steps E) and F). In step E1), an intermediate layer may be produced. The intermediate layer is preferably deposited directly on the planarization layer. The intermediate layer may be composed of $Al_{x5}Ga_{1-x5}In_{y5}N$ or of $Ga_{1-y5}In_{y5}N$. The intermediate layer is preferably free or substantially free from Al so that x5 is <0.2 or <0.1 or <0.02. In particular, the intermediate layer is entirely free from Al so that x5=0.

Furthermore, the intermediate layer preferably has little or no In so that y5 is less than or equal to 0.2 or 0.1 or 0.05.

The intermediate layer may be grown comparatively thick. In particular, the thickness of the intermediate layer is at least 0.5 µm or 1 µm or 3 µm and/or at most 12 µm or 10 µm or 7 µm. The intermediate layer preferably has a constant, uniform thickness.

The method may comprise a step H). Step H) is preferably carried out after step G). In step H), the semiconductor layer sequence, which is produced in particular in the wafer composite, may be singulated. Singulation includes, for example, scribing and breaking, laser treatment and/or etching.

The structural layer, in particular as an InN or InGaN layer, may be produced as follows: A growth temperature is at 400° C. to 650° C., preferably 500° C. to 620° C. A pressure is alternatively or additionally at 50 mbar to 1000 mbar, preferably 100 mbar to 200 mbar. A typical flow rate for the source gas for nitrogen, in particular $NH_3$, is, for example, 50 slm to 150 slm, preferably at least 70 slm. In this example slm stands for standard liters/minute. A typical ratio of the source gas for nitrogen and a source gas for indium, thus in particular a ratio of $NH_3$/TMIn, is, for example, 10,000 to 100,000, preferably 20,000 or greater. A typical growth rate is approximately 100 nm/h. For example, for a 100 nm thick closed layer, a growth time is approximately 60 min. For pyramids with an average height of 100 nm, the growth time is approximately 30 min.

The buffer layer and/or the cover layer may be produced as specified in U.S. Pat. No. 9,343,615 B2, the subject matter of which with respect to the growth of these layers is incorporated herein by reference.

The planarization layer, in particular a 2D GaN layer, may be produced as follows: A ratio of the fluxes of the source gases for the V/III components is typically at least 2000. The growth temperature is preferably 1050° C. or more. The growth is preferably carried out slowly, for example, at a growth rate of at most 300 nm/h.

We also provided a light-emitting diode chip. The light-emitting diode chip is preferably produced by a process as described in connection with one or more of the examples described above. Features for the method are thus disclosed for the light-emitting diode chip and vice versa.

The light-emitting diode chip may comprise a carrier and a semiconductor layer sequence on the carrier. The semiconductor layer sequence may comprise a functional layer sequence that generates radiation. The functional layer sequence may be located on a side of a planarization layer facing the carrier. The planarization layer may be flat on this side. A continuous cover layer may be located directly on a side of the planarization layer facing away from the carrier. The cover layer may be part of the semiconductor layer sequence, in the same way as the functional layer sequence and the planarization layer. A plurality of pyramid-shaped structural elements may be formed in the planarization layer and in the cover layer. The cover layer may form the structural elements true to shape. The structural elements may be partially or completely filled with $Al_{x2}Ga_{1-x2-y2}In_{y2}N$, wherein $x2 \geq 0.6$.

The carrier can be a semiconductor substrate such as a silicon substrate or a germanium substrate. Ceramic carriers made of, for example, aluminum nitride can also be used. Metal carriers of, for example, molybdenum, or circuit boards such as metal core boards or printed circuit boards can also be used as carrier. The carrier preferably comprises electrical contact surfaces and electrical connection lines that energize and externally electrically contact the light-emitting diode chip.

In the finished light-emitting diode chip, the cover layer is a continuous, uninterrupted layer. This is especially true for all areas not configured for energization and current impression in the side of the semiconductor layer sequence facing away from the carrier and/or which are connected to electrical contact webs, conductor tracks or contact surfaces such as bondpads. Such areas can be provided with an opaque metal and can be free of the cover layer.

In the following, a method and a light-emitting diode chip described herein are explained in more detail below with reference to the drawings. The same reference signs indicate the same elements in the individual figures. However, there are no references to scale shown. Rather, individual elements may be shown exaggeratedly large for a better understanding.

An example of a method of producing light-emitting diode chips 10 is described in FIGS. 1 to 7. According to FIG. 1, a growth substrate 1 is provided. The growth substrate 1 preferably has smooth, non-structured main sides. The growth substrate 1 is in particular a sapphire substrate.

Figure 2:
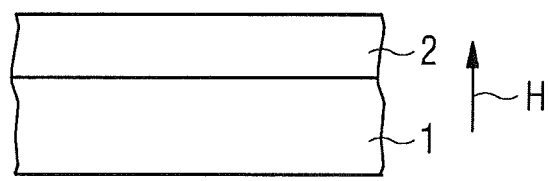
Figure 3:
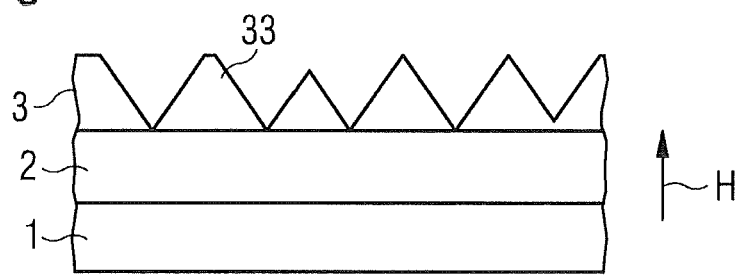
FIGS. 3D and 4B show electron micrographs after method steps of the method.
Figure 3:
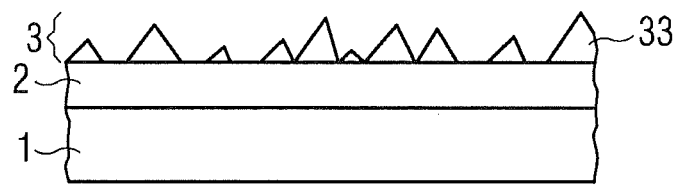
Figure 3:
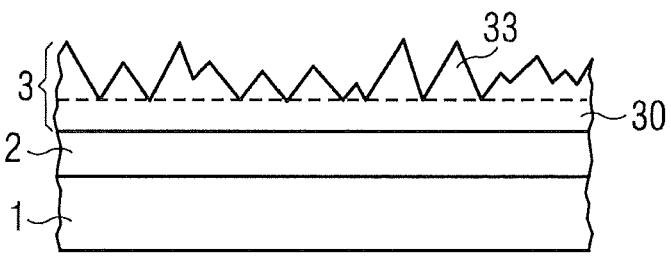
Figure 3:
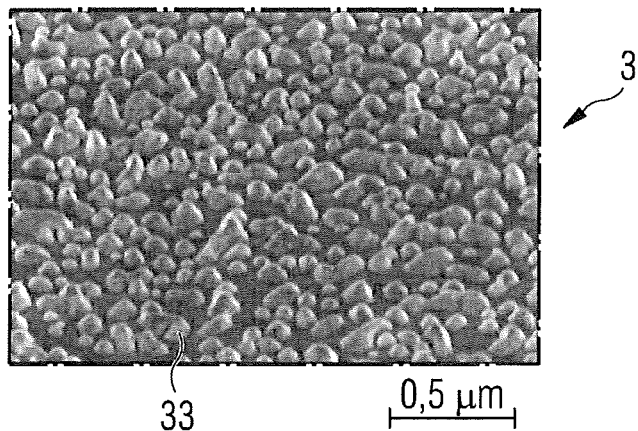
Figure 4:
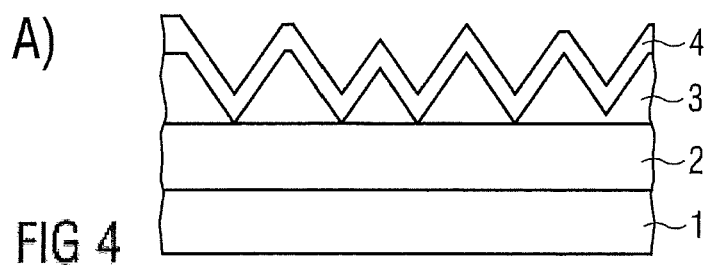
Figure 4:
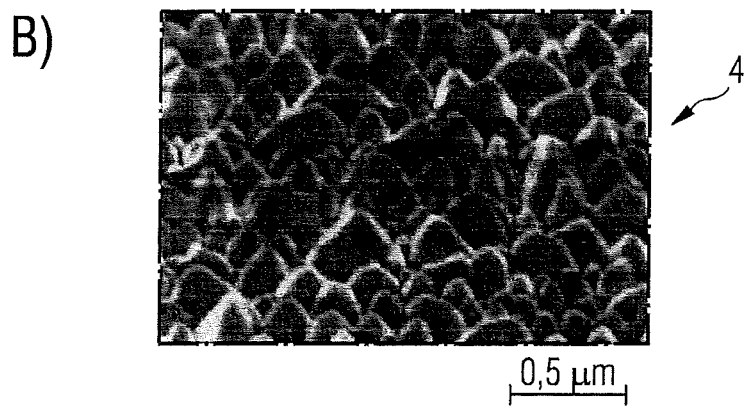

According to FIG. 2, in an optional method step a buffer layer 2 is produced on the growth substrate 1. The buffer layer 2 is made of AlInGaN, preferably of AlN. The buffer layer has a thickness of approximately 30 nm. The buffer layer is produced with a uniform thickness. A main growth direction H is oriented perpendicular to the main sides of the growth substrate 1.

FIG. 3A illustrates that a structural layer 3 is deposited on the buffer layer 2. The structural layer 3 has a plurality of pyramid-shaped structural elements 33. The structural layer 3 is formed of AlInGaN, preferably from InN. A mean height of the structural elements 33 in the direction away from the growth substrate 1 lies, for example, at approximately 100 nm, wherein individual heights of the structural elements 33 can vary considerably.

According to FIG. 3A, base points of the structural elements 33 abut at the buffer layer 2 so that an even continuous structural layer 3 is produced. In contrast, in FIG. 3B an areal density of the structural elements 33 is lower so that in places the buffer layer 2 is not covered by the structural elements 33. A surface proportion of the structural elements 33 on top of the buffer layer 2 is preferably at least 50% or 70% or 90%.

FIG. 3C shows that the structural layer 3 consists of a region with the structure elements 33 as well as a continuous partial layer 30. The partial layer 30 has a thickness of approximately 20 nm, for example. The partial layer 30 and the structural elements 33 are preferably produced from the same material composition, within manufacturing tolerances.

FIG. 3D shows a SEM image after the application of the structural layer 3. The pyramid-shaped structural elements 33 have a comparatively large bandwidth of heights and diameters. In addition, no geometrically exact pyramids are formed. In other words, a relatively irregular surface is produced by the structural elements 33.

In the method step of FIG. 4A, a cover layer 4 is grown directly on the structural layer 3. The cover layer 4 is made of AlGaN with an Al content of at least 80%. A thickness of the cover layer 4 is approximately 40 nm, for example.

FIG. 4B shows a SEM image after production of the cover layer 4. The structural elements 33 are still present on a side of the cover layer 4 facing away from the growth substrate 1. There is thus no or no significant change in the structure by the cover layer 4, the structure being defined by the structural elements 33 in the structural layer 3.

Figure 5:
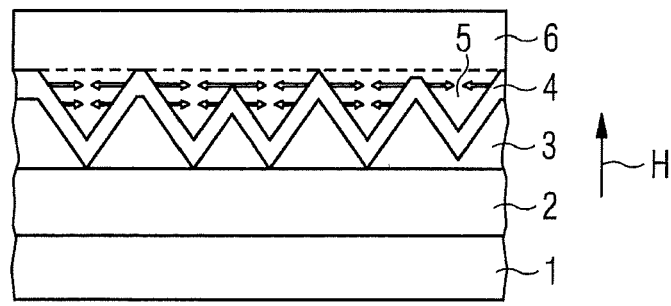

According to FIG. 5, a planarization layer 5 is produced starting from the structured cover layer 4 by predominantly two-dimensional growth in the direction parallel to the main side of the growth substrate 1. The planarization layer 5 is formed of AlInGaN, preferably of GaN. It is possible for the planarization layer 5, as well as for the cover layer 4, the structural layer 3 and the buffer layer 2, to be undoped.

An intermediate layer 6 is optionally applied directly to the planarization layer 5. The intermediate layer 6 may have the same material composition as the planarization layer 5. In this respect, the planarization layer 5 and the intermediate layer 6 may also be regarded as a single layer. In the figures, the layers 5, 6 are therefore separated only by a dash line. As an option, the intermediate layer 6 has a different material composition than the planarization layer 5. The intermediate layer 6 is preferably made of InGaN or of GaN.

Figure 6:
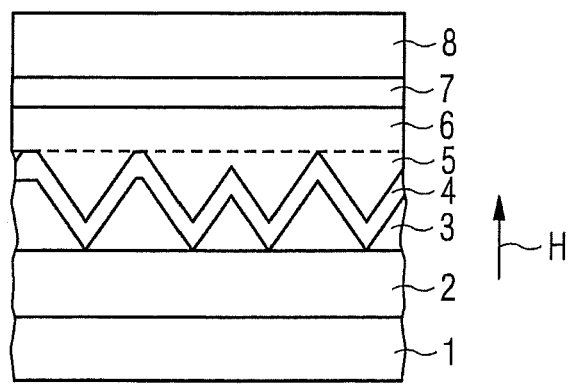
Figure 7:
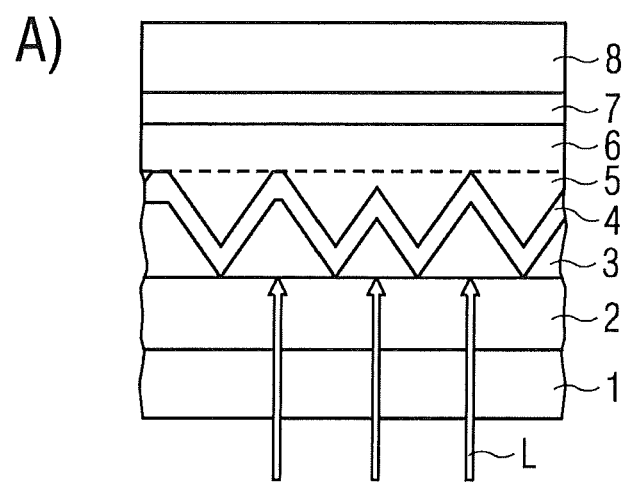
Figure 7:
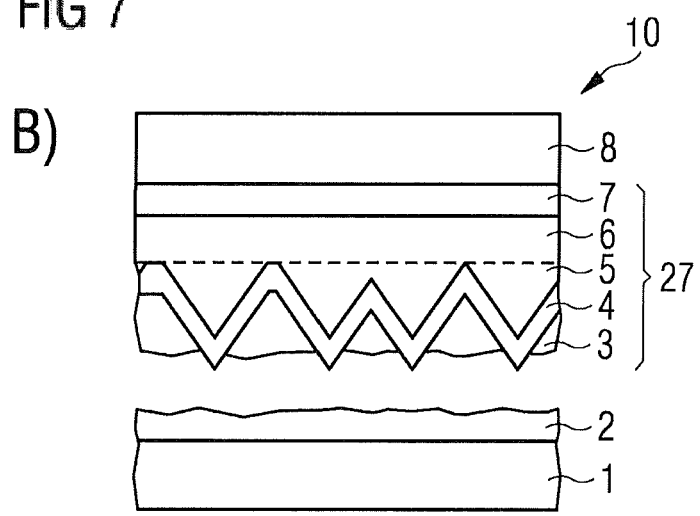

According to FIG. 6, a functional layer sequence 7 is epitaxially grown on the intermediate layer 6. The functional layer sequence 7 contains at least one active zone that generates radiation. A carrier 8, for example, a silicon carrier, is attached to a side of the functional layer sequence 7 facing away from the growth substrate 1.

FIG. 7A illustrates that a laser beam L is irradiated through the growth substrate 1 and the buffer layer 2 and is absorbed in the structural layer 3. As a result, the structural layer 3 is partially destroyed so that the growth substrate 1 can be removed from the functional layer sequence 7 as shown in FIG. 7B.

Remnants of the structural layer 3 remain in the structure reproduced in the cover layer 4. The growth substrate 1 is preferably not affected by this laser lift-off process with the laser radiation L. A side of the buffer layer 2 facing away from the growth substrate 1 is partially impaired and destroyed. After removal of the buffer layer 2, the growth substrate 1 can be reused.

Because the structural layer 3 that is in particular InN has an absorption edge of approximately 0.7 eV, the laser radiation L is absorbed very strongly and only locally. A rapid, efficient and precise laser lift-off method is thereby possible.

Further, due to the cover layer 4 on the structural layer 3, a comparatively precise lattice matching to the material system of the intermediate layer 6 and of the functional layer sequence 7 can be achieved. Thus, it is possible to reduce the thickness and growth time of the planarization layer 5 and/or of the intermediate layer 6. By overgrowing the structural elements 33, an efficient reduction of dislocations is possible.

Figure 8:
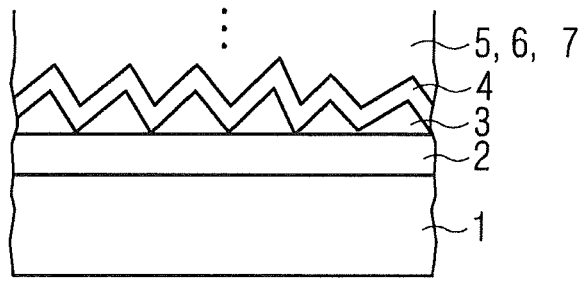
Figure 8:
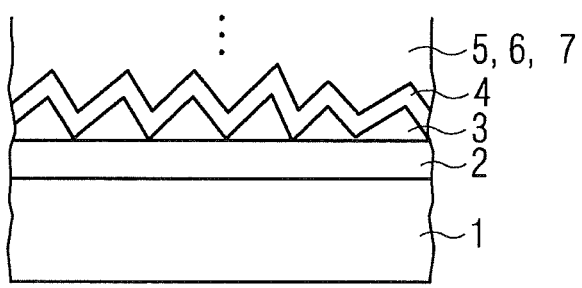
Figure 8:
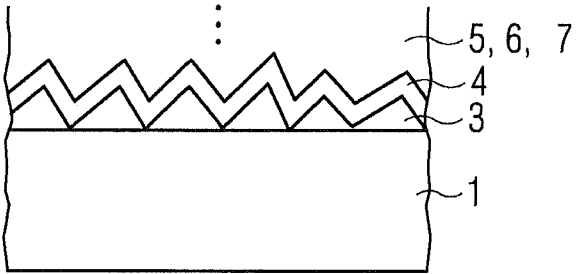
Figure 8:
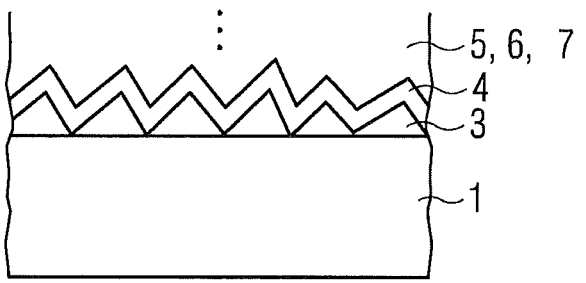

Possible variants of the method are summarized in FIG. 8. In the particularly preferred example of FIG. 8A, the AlN buffer layer 2 is present on the sapphire substrate 1, followed by the InN structural layer 3 and the AlN cover layer 4. The further layers 5, 6, 7 are only indicated.

In the preferred example of FIG. 8B, the buffer layer 2 is of AlGaInN with a high percentage of Al and Ga. The structural layer 3 is composed of AlGaInI with a high proportion of In. The cover layer 4 is an AlGaInN layer with a high percentage of Al.

In the example of FIG. 8C, the InN structural layer 3 is located directly on the sapphire substrate 1, followed by the AlN cover layer 4. Contrary to that, in FIG. 8D the structural layer 3 is of AlGaInN with a high percentage of In and the cover layer 4 is of AlGaInN with a high percentage of Al.

Figure 9:
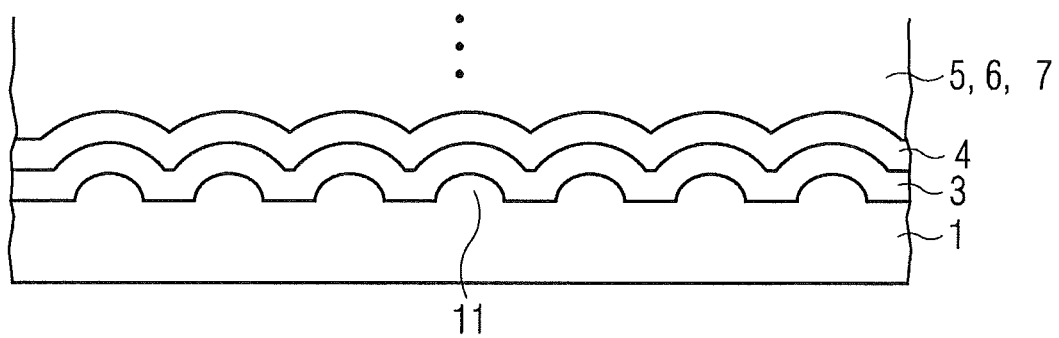

In the example of FIG. 9, the growth substrate 1 is a patterned sapphire substrate with preferably regularly arranged dome structures 11. The structural layer 3 and the cover layer 4 form the dome structures 11 true to shape. Optionally, a buffer layer (not shown) may be present. The remaining layers 5, 6, 7 can be produced as explained in connection with the previous examples.

Figure 10:
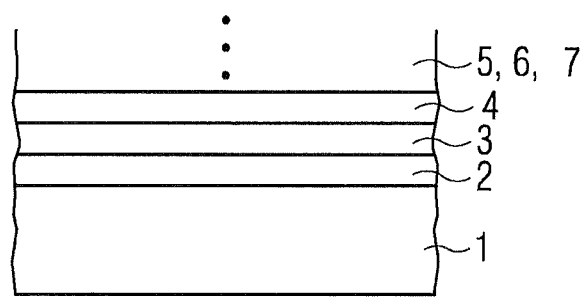

FIG. 10 shows that the structural layer 3 is a plane-parallel, continuous layer, preferably of InN. The substrate 1 is a sapphire substrate with a flat side facing the structural layer 3. The structural layer 3 is destroyed in a laser lift-off process so that the growth substrate 1 can be detached without damage. The buffer layer 2 is optional. Again, it is possible to produce the remaining layers 5, 6, 7 as explained above.

The components shown in the figures follow, unless indicated otherwise, preferably in the order given in each example directly on top of one another. Layers that are not touching in the figures are arranged at a distance from each other. As far as lines are drawn parallel to one another, the corresponding surfaces are likewise aligned parallel to one another. Also, unless indicated otherwise, the relative thickness ratios, length ratios and relative position of the illustrated components are correctly reproduced in the figures.

Our methods and chips are not limited by the description given in the examples. Rather, this disclosure includes each new feature as well as each combination of features, which in particular includes each combination of features in the appended claims, even if the feature or combination itself is not explicitly stated in the claims or examples.

This application claims priority of DE 10 2017 106 888.0, the subject matter of which is incorporated herein by reference.

The invention claimed is:

1. A method of producing light-emitting diode chips comprising A) and C)-F) in order:
   A) providing a growth substrate,
   C) producing a structural layer, the structural layer comprising $Al_{x1}Ga_{1-x1-y1}In_{y1}N$, wherein $y1 \geq 0.5$, and a plurality of structural elements with a mean height of at least 50 nm so that a side of the structural layer facing away from the growth substrate is rough,
   D) producing a cover layer on the structural layer, the cover layer forming the structural layer true to shape and comprising $Al_{x2}Ga_{1-x2-y2}In_{y2}N$, wherein $x2 \geq 0.6$,
   E) producing a planarization layer on the cover layer, a side of the finished planarization layer is flat and the planarization layer comprises $Al_{x3}Ga_{1-x3-y3}In_{y3}N$, wherein $x3+y3 \leq 0.2$, and
   F) growing a functional layer sequence that generates radiation on the planarization layer.

2. The method according to claim 1, further comprising a step B) between steps A) and C),
   wherein, in step B), a buffer layer comprising $Al_{x4}Ga_{1-x4-y4}In_{y4}N$, wherein $x4 \geq 0.4$ and $1-x4-y4 \geq 0.4$ and $y4 \leq 0.1$, is formed directly on the growth substrate and the structural layer is produced directly on the buffer layer, and
   the structural layer is produced in step C) so that the structural elements are pyramid-shaped.

3. The method according to claim 2,
   wherein the buffer layer comprises AlN or $Al_{x4}Ga_{1-x4-y4}In_{y4}N$, wherein $x4 \geq 0.5$ and $1-x4-y4 \geq 0.4$ and $y4 \leq 0.05$, and a thickness of the buffer layer is 20 nm to 70 nm, and
   the buffer layer is radiation-transmissive at wavelengths above 360 nm.

4. The method according to claim 1, wherein the structural layer is produced directly on the growth substrate.

5. The method according to claim 4, wherein, in step C), the structural layer is produced so that the structural elements are pyramid-shaped.

6. The method according to claim 2, wherein the structural layer comprises InN and a mean height of the pyramid-shaped structural elements is 50 nm to 200 nm.

7. The method according to claim 1, further comprising a step G) after step F),
   wherein, in step G), the functional layer sequence is removed from the growth substrate by a laser lift-off process, and
   a laser beam passes through the growth substrate and is absorbed in the structural layer so that the structural layer is partially destroyed.

8. The method according to claim 1,
   wherein the structural layer is produced as a closed, continuous layer, and
   the structural layer has reached its final shape directly after its growth so that no subsequent material removal is required to form the structural layer.

9. The method according to claim 8, wherein a minimum thickness of the structural layer at base points of the structural elements is 10 nm to 50 nm.

10. The method according to claim 1, wherein a height distribution of heights of the structural elements over the growth substrate has a standard deviation of 30% to 60% of the mean height of the structural elements.

11. The method according to claim 1, wherein the cover layer is a continuous, uninterrupted layer of $Al_{x2}In_{y2}N$, wherein $x2 \geq 0.75$, and a mean thickness of the cover layer is 30 nm to 100 nm.

12. The method according to claim 2, wherein the structural layer, the cover layer and the buffer layer are produced by sputtering and the planarization layer and the functional layer sequence are epitaxially grown.

13. The method according to claim 1, wherein a side of the growth substrate facing the structural layer is formed in a planar manner.

14. The method according to claim 1, wherein the growth substrate is a sapphire substrate.

15. The method according to claim 1, further comprising a step E1) between steps E) and F),
   wherein, in step E1), an intermediate layer comprising $Ga_{1-y5}In_{y5}N$, wherein $y5 \leq 0.1$, is deposited directly on the planarization layer and the intermediate layer has a thickness of 0.5 µm to 12 µm.

16. A light-emitting diode chip comprising a carrier and a semiconductor layer sequence on the carrier, wherein
   at a planar side of a planarization layer comprising $Al_{x3}Ga_{1-x3-y3}In_{y3}N$, wherein $x3+y3 \leq 0.2$, facing the carrier, the semiconductor layer sequence comprises a functional layer sequence that generates radiation,
   directly on a side of the planarization layer facing away from the carrier, a continuous cover layer comprises $Al_{x2}Ga_{1-x2-y2}In_{y2}N$, wherein $x2 \geq 0.6$, is formed,
   the cover layer is part of the semiconductor layer sequence,
   a plurality of pyramid-shaped structural elements are formed in the planarization layer and in the cover layer, the cover layer covers the structural elements true to shape, and
   the structural elements are partially filled with $Al_{x2}Ga_{1-x2-y2}In_{y2}N$, wherein $x2 \geq 0.6$.

* * * * *